United States Patent
Baumann et al.

(10) Patent No.: US 8,105,755 B2
(45) Date of Patent: Jan. 31, 2012

(54) METHOD FOR PROCESSING OF PHOTOPOLYMER PRINTING PLATES WITH OVERCOAT

(75) Inventors: Harald Baumann, Osterode/Harz (DE); Christopher D. Simpson, Osterode (DE); Ulrich Fiebag, Nienstadt (DE); Bernd Strehmel, Berlin (DE)

(73) Assignee: Eastman Kodak Company, Rochester, NJ (US)

( * ) Notice: Subject to any disclaimer, the term of this patent is extended or adjusted under 35 U.S.C. 154(b) by 638 days.

(21) Appl. No.: 12/300,206

(22) PCT Filed: Jun. 5, 2007

(86) PCT No.: PCT/EP2007/004988
§ 371 (c)(1),
(2), (4) Date: Nov. 10, 2008

(87) PCT Pub. No.: WO2007/144096
PCT Pub. Date: Dec. 21, 2007

(65) Prior Publication Data
US 2009/0148794 A1    Jun. 11, 2009

(30) Foreign Application Priority Data

Jun. 14, 2006 (EP) .................................... 06012306

(51) Int. Cl.
  *G03F 7/00* (2006.01)
  *G03F 7/26* (2006.01)
  *G03C 5/26* (2006.01)
  *B41N 1/00* (2006.01)
(52) U.S. Cl. ...... 430/302; 430/434; 101/453; 101/463.1
(58) Field of Classification Search ........................ None
See application file for complete search history.

(56) References Cited

U.S. PATENT DOCUMENTS 7,752,966 B2 *   7/2010   Teng ............................ 101/451

FOREIGN PATENT DOCUMENTS

| EP | 0 326 715 | 8/1989 |
| WO | 02/101469 | 12/2002 |
| WO | 2005/111727 | 11/2005 |

* cited by examiner

*Primary Examiner* — Cynthia Kelly
*Assistant Examiner* — Chanceity Robinson
(74) *Attorney, Agent, or Firm* — T. Lanny Tucker

(57) ABSTRACT

Method is described for producing an imaged lithographic printing plate from a precursor comprising a free-radical polymerizable coating and an oxygen-impermeable overcoat, characterized in that removing the overcoat, developing and gumming is carried out in one single step.

10 Claims, No Drawings

METHOD FOR PROCESSING OF PHOTOPOLYMER PRINTING PLATES WITH OVERCOAT

The present invention relates to a method for processing imagewise exposed lithographic printing plates having an overcoat, in particular a method where removal of the overcoat, developing and gumming is carried out in a single step without any intermediate washing step.

Lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source part of which is comprised of UV radiation. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened (for instance by photopolymerization) due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Alternatively, the plate can also be imagewise exposed digitally without a film. According to recent developments, plate precursors with heat-sensitive layers are used wherein by imagewise direct heating or irradiation with IR radiation that is converted into heat, differences in the developer solubility of the heated and unheated areas of the coating are generated.

Sometimes water-soluble polymers are used as temporary coatings (sometimes called "overcoat") on lithographic printing plate precursors having an oxygen-sensitive coating like a photopolymerizable coating. The water-soluble polymers have the function of protecting the coating from atmospheric oxygen during storage, exposure and in particular during the time between exposure and further processing (development and the like). During that time period the temporary coating has to exhibit a sufficient adhesion to the light-sensitive substrate so that safe handling (manufacture, packing, transport, exposure etc.) is guaranteed without tearing of the layers. Prior to the development the overcoat is removed, preferably by washing with water.

For a clean printed image it is necessary that the image areas (i.e. the imagewise remaining coating) accept the printing ink well, while the non-image areas (i.e. the imagewise revealed substrate, such as e.g. an aluminum substrate) should not accept the printing ink. In order to protect the imagewise revealed substrate, such as e.g. an aluminum substrate, against fingerprints, the formation of aluminum oxide, corrosion and mechanical attacks, such as scratches, when the printing plate is mounted in the printing machine, i.e. to maintain and possibly improve the hydrophilic nature of the non-image areas, the developed printing plate is usually subjected to a "gumming" treatment (also referred to as "finishing"). Gumming the plate prior to storing it or before long periods of standstill of the printing machine ensures that the non-image areas remain hydrophilic. When printing is started, the gumming solution has to be able to be washed off the plate quickly with the fountain solution so that the image areas are capable of accepting ink immediately. Gumming solutions have been known for a long time and are for instance disclosed in DE 29 26 645, DE 20 42 217 A1, U.S. Pat. No. 4,880,555 A1, U.S. Pat. No. 4,033,919 A1, and U.S. Pat. No. 4,162,920 A1.

The gumming compositions described in the prior art all have in common that they comprise a water-soluble colloid or binder, such as e.g. gum arabic, polyvinyl alcohol, polyvinyl pyrrolidone, carboxymethyl cellulose, sorbite or polyacrylamide and they are usually adjusted to a pH value<6. Gumming with an alkaline solution of a water soluble starch or starch derivative preferably containing a tetraborat is disclosed in DE 10345388 A1; before the gumming step separate steps for washing off the overcoat and developing are carried out.

The processing of lithographic printing plate precursors having an overcoat is time consuming and results in a big amount of waste water since the following steps are usually required after exposure and optional pre-heat step:
(1) removing the overcoat by washing with water
(2) removing the non-image areas by treating with an aqueous alkaline developer
(3) rinsing with water
(4) gumming with a usually acidic gumming composition.

In U.S. Pat. No. 6,482,578 B2, U.S. Pat. No. 6,383,717 B1 and WO 02/31599 A2 aqueous developers for negative working precursors are described; overcoats are however washed off in the pre-wash section of the processor before developing and gumming is carried out after rinsing the developed plate.

Suitable developers for negative working precursors are also described in U.S. Pat. No. 4,370,406 and U.S. Pat. No. 4,350,756; however these patents do not deal with precursors having an overcoat. In U.S. Pat. No. 5,155,011 aqueous developers for reproduction layers with overcoat are described, which comprise an organic solvent, an alkali agent, an anionic surfactant, an alkanoic acid, an emulsifier, a complexing agent and a buffering substance; the patent does not deal with gumming.

In GB 1,148,362 photopolymerizable elements with overcoat are disclosed; the elements are processed by treating the exposed elements with developer, rinsing with water and optionally gumming. US 2003/0165777 A1 and US 2004/0013968 A1 disclose non-alkaline aqueous developers for negative precursors.

For precursors without overcoat processes are described in the prior art for simultaneously developing and gumming. For example DE 25 30 502 A1 discloses a process and a device for simultaneously developing and gumming of a photocurable layer; the liquid used comprises water, an organic solvent and a water-soluble colloid. Treatment of negative precursors with overcoat is not disclosed there. U.S. Pat. No. 4,200,688 deals with an emulsion having an aqueous phase and a water immiscible phase that can be used for removing non-image areas and for conserving the non-image part after development; these emulsions tend to become instable during loading and negative precursors with overcoat are not described. In U.S. Pat. No. 4,381,340 compositions comprising 2-propoxyethanol, a nonionic surfactant with a HLB value of more than 17, an inorganic salt and a polymeric film former are described which can be used for simultaneously developing and finishing; the treatment of precursors with overcoat is not described. WO 02/101469 describes the processing of precursors with an aqueous alkaline developing-gumming solution comprising a specific polyhydroxy compound; negative working precursors with overcoat are not described. A developing and finishing composition containing a specific alcohol, a phosphate, a specific polymer, citric acid or benzoic acid, an octylsulfate, benzoate, citrate and solvate as essential components is disclosed in U.S. Pat. No. 4,873,174; precursors with overcoat are not disclosed. Developing a precursor with photopolymerizable layer with a gum solution of a pH up to 9 is disclosed in WO 2005/111727 A1.

It is the object of the present invention to provide a process which simplifies the processing of negative working precursors having an overcoat and thereby saves time and money (by using a small and cheap processor) and reduces the amount of waste water while at the same time developability, photosensitivity and roll up (also known as start up) are not affected.

This object is surprisingly achieved by a method comprising
(a) imagewise exposing a negative working lithographic printing plate precursor comprising
  (i) a substrate with a hydrophilic surface
  (ii) a free-radical polymerizable coating and
  (iii) an oxygen-impermeable water-soluble or dispersible overcoat to radiation for which the free-radical polymerizable coating is sensitive,
(b) treating the imagewise exposed precursor with an aqueous alkaline processing liquid comprising
  (i) water
  (ii) at least one surfactant
  (iii) at least one water-soluble film forming hydrophilic polymer
  (iv) at least one alkaline reagent in an amount sufficient for obtaining a pH of 9.5 to 14 and
  (v) optionally one or more additives selected from organic solvents, biocides, complexing agents, buffer substances, filter dyes, antifoaming agents, anticorrosive agents and radical inhibitors,
(c) removing any excess of processing liquid from the treated precursor obtained in step (b),
(d) optionally drying,
(e) optionally baking,
(f) mounting the precursor obtained in step (c), (d) or (e) on a press and then contacting it either simultaneously or subsequently with fountain solution and printing ink, with the proviso that there is no washing step between any of steps (a) to (f), with the further proviso that step (c) is not a washing step and with the further proviso that after step (b) there is no gumming step.

Negative Working Lithographic Printing Plate Precursors

The precursors imaged according to the method of the present invention are negative working and comprise a substrate with a hydrophilic surface, a free-radical polymerizable coating and an oxygen-impermeable overcoat.

Substrates

The substrate used for the precursors is preferably a dimensionally stable plate or foil-shaped material like one that has already been used as a substrate for printing matter. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the radiation-sensitive coating. Furthermore, a composite film can be used wherein an aluminum foil has been laminated onto a plastic film, such as e.g. a polyethylene terephthalate film, or paper, or a plastic film onto which aluminum has been applied by means of vapor deposition.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte or $HNO_3$, and optionally anodizing, e.g. in sulfuric acid or phosphoric acid.

An aluminum foil which preferably has a thickness of 0.1 to 0.7 mm, more preferred 0.15 to 0.5 mm, is an especially preferred substrate. It is preferred that the foil be grained (preferably electrochemically) and then show an average roughness of 0.2 to 1 µm, especially preferred 0.3 to 0.8 µm.

According to an especially preferred embodiment, the grained aluminum foil was furthermore anodized. The layer weight of the resulting aluminum oxide is preferably 1.5 to 5 $g/m^2$, especially preferred 2 to 4 $g/m^2$.

Furthermore, in order to improve the hydrophilic properties of the surface of the metal substrate that has been grained and optionally anodized, the metal substrate can be subjected to an aftertreatment with an aqueous solution of e.g. sodium silicate, calcium zirconium fluoride, polyvinylphosphonic acid or phosphoric acid.

The details of the above-mentioned substrate treatment are well known to the person skilled in the art.

Free-Radical Polymerizable Coating
(UV/VIS and IR)

The negative working coating comprises as essential features (a) at least one absorber component selected from photoinitiators and sensitizer/coinitiator systems which absorbs radiation of a wavelength in the range of 250 to 1,200 nm and is capable of initiating a free-radical polymerization and (b) at least one free-radical polymerizable monomer, oligomer and/or prepolymer.

Absorber Component

The absorber component is selected from photoinitiators and sensitizer/coinitiator systems.

The absorber component is selected such that it is capable of significant absorption in the range in which the radiation source to be used later on during imaging emits; preferably, the absorber shows an absorption maximum in that range. Thus, if the radiation-sensitive element is e.g. going to be imaged by means of an IR laser, the absorber should essentially absorb radiation in the range of about 750 to 1,200 nm and preferably show an absorption maximum in that range. On the other hand, if imaging is to be carried out by means of UV/VIS radiation, the absorber should essentially absorb radiation in the range of about 250 to 750 nm and preferably show an absorption maximum in that range. Suitable photoinitiators and/or sensitizers are known to the person skilled in the art, or it can easily be determined whether significant absorption occurs in the desired wave length range by means of simple tests (e.g. recording an absorption spectrum).

In the present invention, a photoinitiator is a compound capable of absorbing radiation when exposed and of forming free-radicals by itself, i.e. without the addition of coinitiators. Examples of suitable photoinitiators absorbing UV or VIS radiation include triazine derivatives with 1 to 3 $CX_3$ groups (wherein every X is independently selected from a chlorine or bromine atom, and is preferably a chlorine atom), hexaarylbisimidazole compounds, benzoin ethers, benzil ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, and 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt.-%, based on the dry layer weight, especially preferred 0.5 to 15 wt.-%.

A sensitizer as referred to in the present invention is a compound which can absorb radiation when it is exposed but which cannot by itself, i.e. without the addition of coinitiators, form free-radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

Coumarin sensitizers of formula (I) are for example suitable for the UV range of the electromagnetic spectrum:

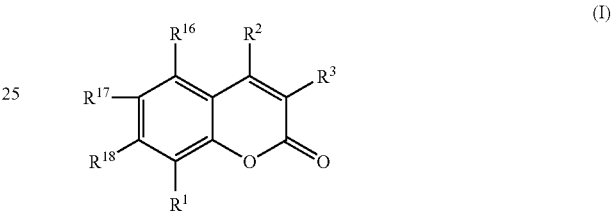

wherein
$R^1$, $R^6$, $R^{17}$ and $R^{18}$ are independently selected from —H, a halogen atom, $C_1$-$C_{20}$ alkyl, —OH, —O—$R^4$ and —$NR^5R^6$, wherein $R^4$ is $C_1$-$C_{20}$ alkyl, $C_5$-$C_{10}$ aryl or $C_6$-$C_{30}$ aralkyl (preferably $C_1$-$C_6$ alkyl) and $R^5$ and $R^6$ are independently selected from a hydrogen atom and $C_1$-$C_{20}$ alkyl,
or $R^1$ and $R^{16}$, $R^{16}$ and $R^{17}$ or $R^{17}$ and $R^{18}$ together form a 5- or 6-membered heterocyclic ring with a heteroatom, selected from N and O, in one or both positions adjacent to the phenyl ring shown in formula (I),
or $R^{16}$ or $R^{17}$ forms, together with each of its two adjacent substituents, a 5- or 6-membered heterocyclic ring with a heteroatom, selected from N and O, in one or both positions adjacent to the phenyl ring shown in formula (I),
wherein each formed 5- or 6-membered heterocyclic ring can independently be substituted with one or more $C_1$-$C_6$ alkyl groups,
with the proviso that at least one of $R^1$, $R^{16}$, $R^{17}$ and $R^{18}$ is different from hydrogen and $C_1$-$C_{20}$ alkyl,
$R^2$ is a hydrogen atom, $C_1$-$C_{20}$ alkyl, $C_5$-$C_{10}$ aryl or $C_6$-$C_{30}$ aralkyl and
$R^3$ is a hydrogen atom or a substituent selected from —COOH, —COOR$^7$, —COR$^8$, —CONR$^9R^{10}$, —CN, $C_5$-$C_{10}$ aryl, $C_6$-$C_{30}$ aralkyl, a 5- or 6-membered heterocyclic optionally benzofused group, a group —CH=CH—R$^{12}$ and

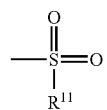

wherein $R^7$ is $C_1$-$C_{20}$ alkyl, $R^8$ is $C_1$-$C_{20}$ alkyl or a 5- or 6-membered heterocyclic group, $R^9$ and $R^{10}$ are independently selected from a hydrogen atom and $C_1$-$C_{20}$ alkyl, $R^{11}$ is $C_1$-$C_{12}$ alkyl or alkenyl, a heterocyclic non-aromatic ring or $C_5$-$C_{20}$ aryl optionally with a heteroatom, selected from O, S and N, and $R^{12}$ is $C_5$-$C_{10}$ aryl or a 5- or 6-membered heterocyclic, optionally aromatic, ring;

or $R^2$ and $R^3$, together with the carbon atoms to which they are bonded, form a 5- or 6-membered, optionally aromatic, ring.

They are described in more detail e.g. in WO 2004/049068 A1.

Furthermore, bisoxazole derivatives and analogues of the formula (II) are suitable for the UV range

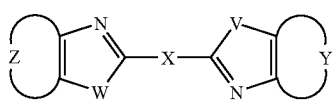
(II)

wherein X is a spacer group comprising at least one C—C double bond conjugated to the heterocycles, Y and Z independently represent an optionally substituted fused aromatic ring and V and W are independently selected from O, S and NR, wherein R is an alkyl, aryl or aralkyl group which can optionally be mono- or polysubstituted, as described in more detail in WO 2004/074929 A2, and oxazole compounds of the formula (III)

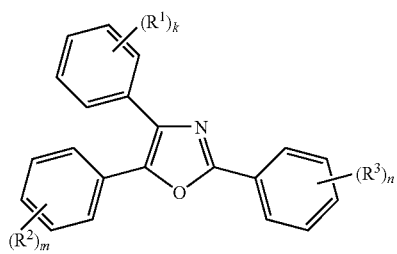
(III)

wherein each $R^1$, $R^2$ and $R^3$ is independently selected from a halogen atom, an optionally substituted alkyl group, an optionally substituted aryl group, which may also be fused, an optionally substituted aralkyl group, a group —$NR^4R^5$ and a group —$OR^6$, wherein $R^4$ and $R^5$ are independently selected from a hydrogen atom, an alkyl, aryl or aralkyl group, $R^6$ is an optionally substituted alkyl, aryl or aralkyl group or a hydrogen atom, and k, m and n are independently 0 or an integer from 1 to 5, as described in detail in WO 2004/074930 A2.

The 1,4-dihydropyridine compounds of formula (I) as described in WO 2004/111731 A1 are an example of another class of sensitizers suitable for the UV range

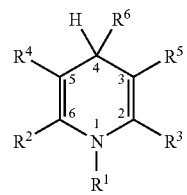
(IV)

wherein $R^1$ is selected from a hydrogen atom, —C(O)$OR^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)$OR^7$, —C(O)$R^7$, —C(O)$NR^8R^9$ and CN, or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —$NR^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

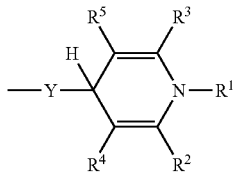

Y is an alkylene or arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

The sensitizers of formula (V)

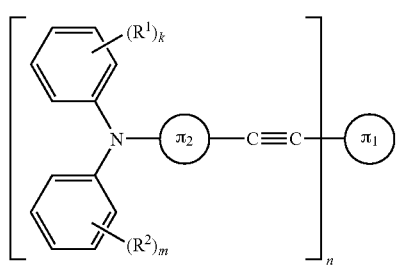

(V)

wherein

and each

independently represent an aromatic or heteroaromatic unit, each $R^1$ and $R^2$ is independently selected from a halogen atom, an alkyl, aryl or aralkyl group, a group —NR$^4$R$^5$ or a group —OR$^6$, $R^4$, $R^5$ and $R^6$ are independently selected from an alkyl, aryl and aralkyl group, n is an integer of at least 2 and k and m independently represent 0 or an integer from 1 to 5, which are described in more detail in DE 10 2004 051 810, as well as the oligomeric or polymeric compounds of formula (VI)

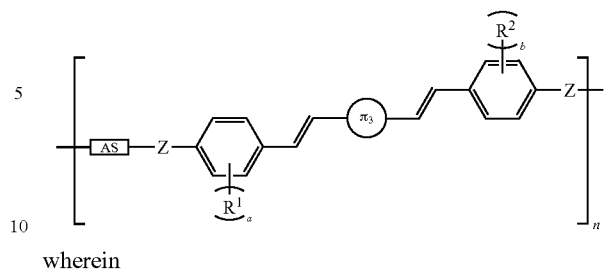

wherein

is an aromatic or heteroaromatic unit or a combination of the two so that a conjugated π-system is present between the two groups Z in structure (I), each Z independently represents a heteroatom connecting the spacer AS and the conjugated system, each $R^1$ and $R^2$ is independently selected from a halogen atom, an alkyl, aryl, alkylaryl or aralkyl group, a group —NR$^3$R$^4$ and a group —OR$^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer, which are described in more detail in DE 10 2004 055 733, are also suitable sensitizers for UV-sensitive elements.

If the radiation-sensitive elements are to be exposed with VIS laser diodes, the cyanopyridone derivatives described in WO 03/069411 A1 are for example suitable as sensitizers.

For IR-sensitive elements, the sensitizers are for example selected from carbon black, phthalocyanine pigments/dyes and pigments/dyes of the polythiophene, squarylium, thiazolium, croconate, merocyanine, cyanine, indolizine, pyrylium or metaldithiolin classes, especially preferred from the cyanine class. The compounds mentioned in Table 1 of U.S. Pat. No. 6,326,122 for example are suitable IR absorbers. Further examples can be found in U.S. Pat. No. 4,327,169, U.S. Pat. No. 4,756,993, U.S. Pat. No. 5,156,938, WO 00/29214, U.S. Pat. No. 6,410,207 and EP 1 176 007 A1.

According to one embodiment, a cyanine dye of formula (VII)

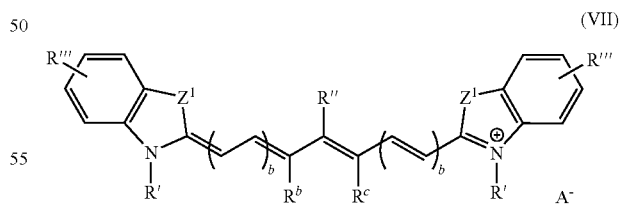

is used, wherein each $Z^1$ independently represents S, O, NR$^a$ or C(alkyl)$_2$;

each R' independently represents an alkyl group, an alkylsulfonate group or an alkylammonium group;

R" represents a halogen atom, SR$^a$, OR$^a$, SO$_2$R$^a$ or NR$^a_2$ (preferably a halogen atom, SR$^a$ or NR$^a$2);

each R''' independently represents a hydrogen atom, an alkyl group, —COOR$^a$, —OR$^a$, —SR$^a$, —NR$^a_2$ or a halogen atom; R''' can also be a benzofused ring;

A⁻ represents an anion;

R$^b$ and R$^c$ either both represent hydrogen atoms or, together with the carbon atoms to which they are bonded, form a carbocyclic five- or six-membered ring;

R$^a$ represents a hydrogen atom, an alkyl or aryl group (in SR$^a$R$^a$ is preferably an aryl group with S being a member of the aryl ring; in NR$^a{}_2$ each R$^a$ is preferably an aryl group);

each b is independently 0, 1, 2 or 3.

If R' represents an alkylsulfonate group, an internal salt can form so that no anion A⁻ is necessary. If R' represents an alkylammonium group, a second counterion is needed which is the same as or different from A⁻.

Of the IR dyes of formula (VII), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indolium tosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium tosylate, 5-chloro-2-(2-{3-[2-(5-chloro-1-ethyl-3,3-dimethyl-1,3-dihydro-indole-2-ylidene)-ethylidene]-2-diphenylamino-cyclopent-1-enyl}-vinyl)-1-ethyl-3,3-dimethyl-3H-indolium salt (e.g. tetrafluoro-borat), and 2-[2-[2-chloro-3-[2-ethyl-(3H-benzthiazole-2-ylidene)-ethylidene]-1-cyclohexene-1-yl]-ethenyl]-3-ethyl-benzothiazolium tosylate.

The following compounds are also IR absorbers suitable for the present invention:

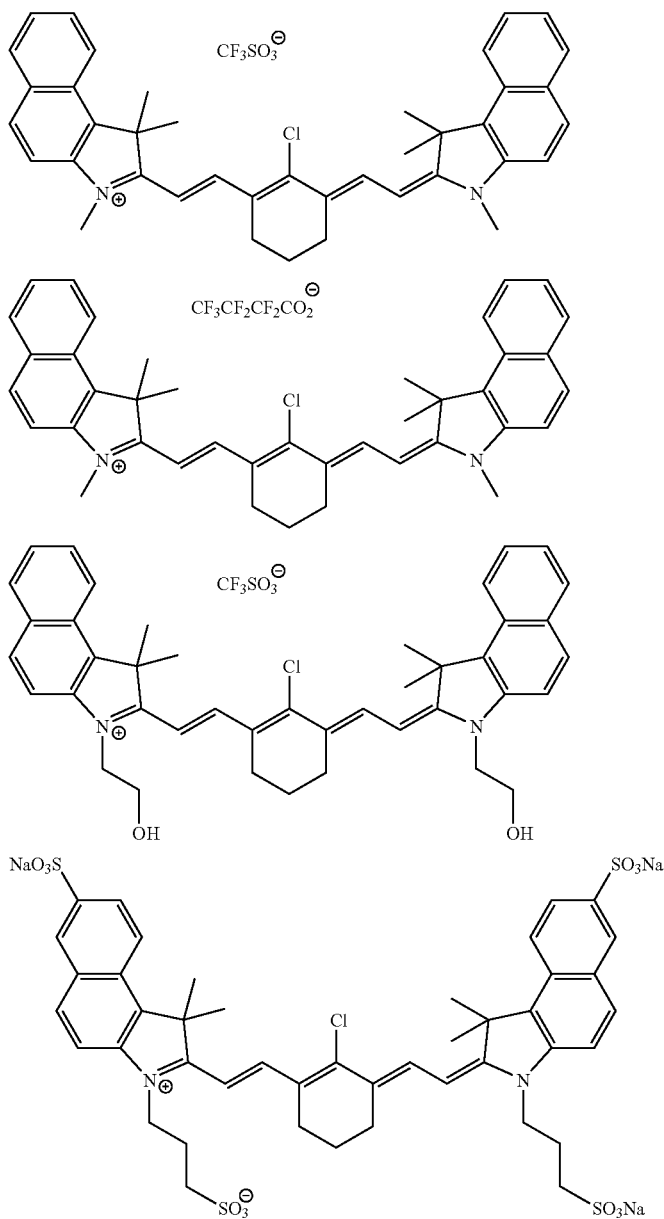

-continued
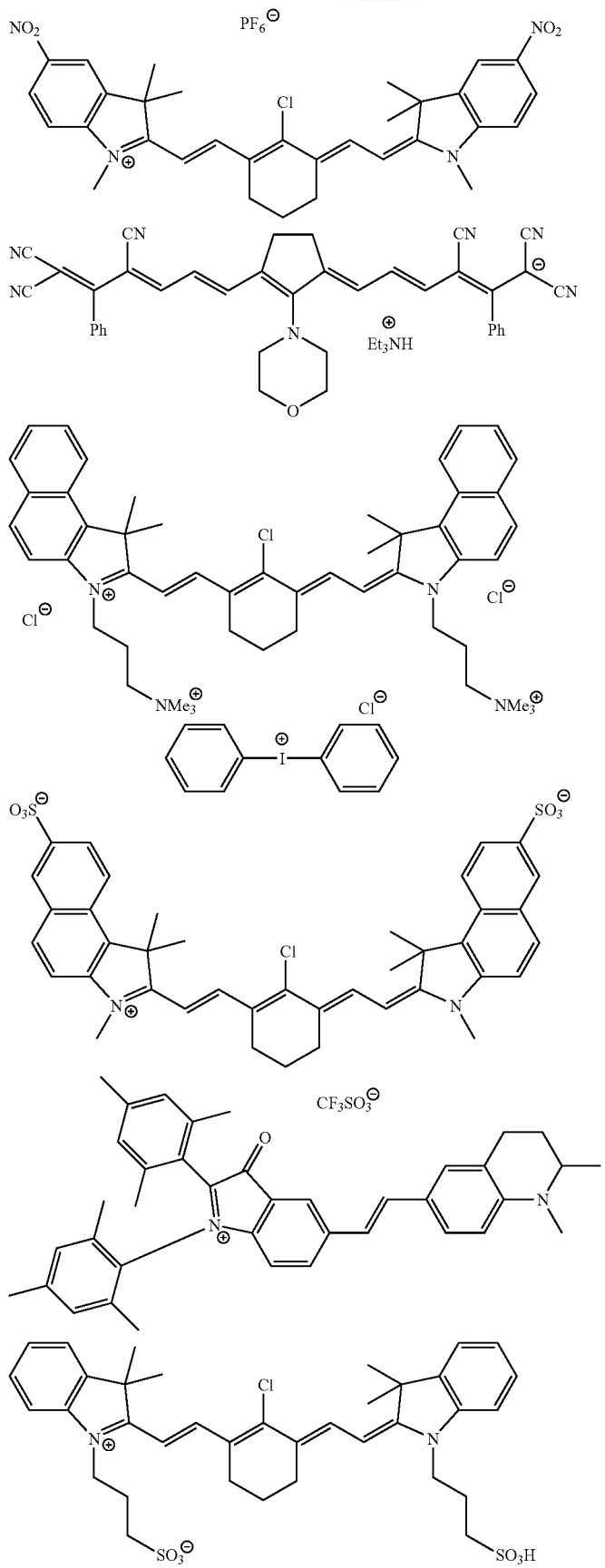

-continued
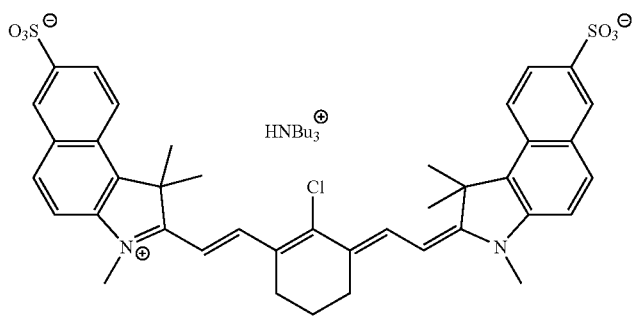
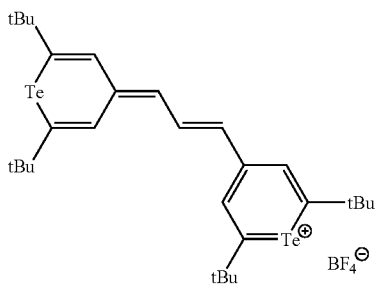
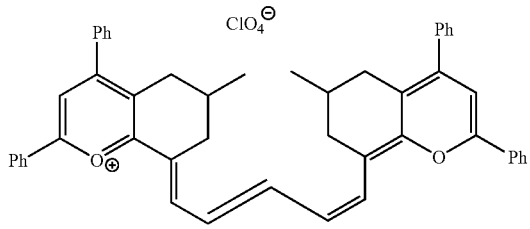
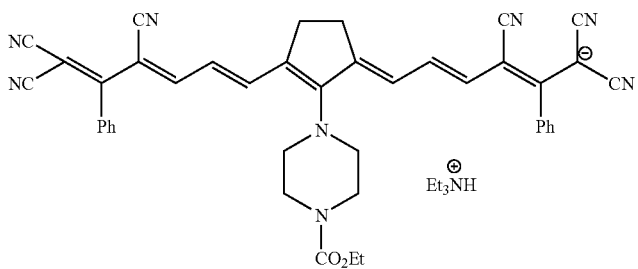
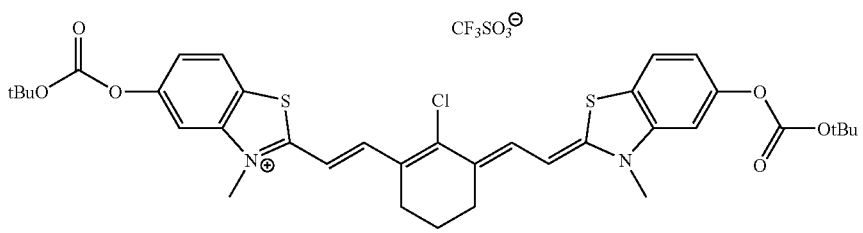
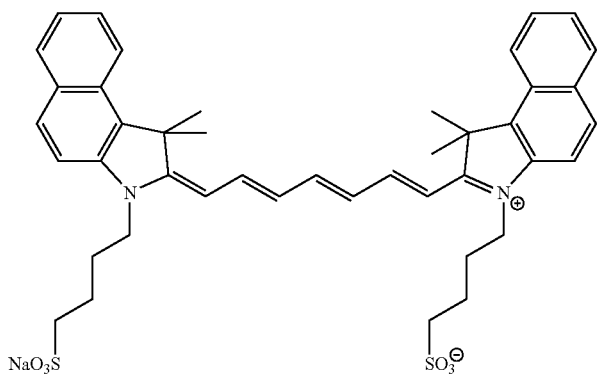

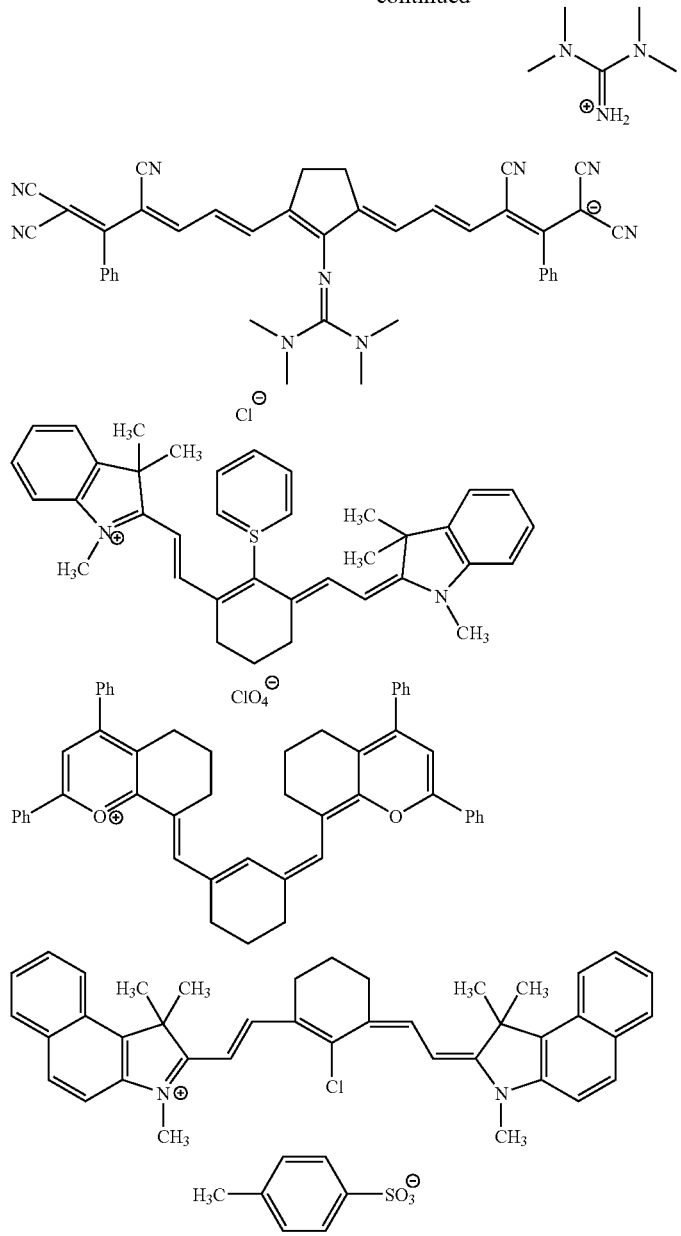

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt.-%, based on the dry layer weight, especially preferred 0.5 to 10 wt.-%. If both photoinitiators and sensitizers are present in the coating, their total amount is preferably 0.5 to 30 wt.-%, based on the dry layer weight, especially preferred 1 to 15 wt.-%.

A coinitiator as referred to in the present invention is a compound that is essentially unable to absorb when irradiated but forms free-radicals together with the radiation-absorbing sensitizers used in the present invention. The coinitiators are for example selected from onium compounds, for example those where the onium cation is selected from iodonium (such as e.g. triaryl-iodonium salts), sulfonium (such as triarylsulfonium salts), phosphonium, oxylsulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl; N-arylglycines and derivatives thereof (e.g. N-phenylglycine); aromatic sulfonyl halides; trihalomethylarylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazole, mercaptobenzimidazole and mercaptotriazole); 1,3,5-triazine derivatives with 1 to 3 CX$_3$ groups (wherein every X is independently selected from a chlorine or bromine atom, and is preferably a chlorine atom), such as e.g. 2-phenyl-4,6-bis(trichloromethyl)-s-triazine, 2,4,6-tris(trichloromethyl)-s-triazine, 2-methyl-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine and 2-[4-(2-ethoxyethyl)-naphtho-1-yl]4,6-bis(trichloromethyl)-s-triazine; oxime ethers and oxime esters, such as for example those derived from benzoin; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4,6-trifluorophenyl-titanium or zirconium); acylphosphine oxides, diacylphosphine oxides and peroxides (e.g. those listed in EP 1 035 435 A1 as activators of the type of an organic peroxide), α-hydroxy or α-amino acetophenones, acylphosphines, acylphosphinesulfides, carbonyl compounds such as aromatic ketones or quinones, e.g. benzophenone derivatives, Michler's ketone, thioxanthone derivatives, anthraquinone derivatives and fluorenone derivatives.

Suitable 2,2',4,4',5,5'-hexaarylbiimidazoles (in the following simply referred to as hexaarylbiimidazoles) are represented by the following formula (VIII):

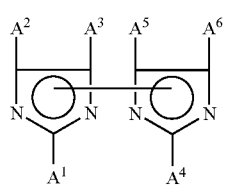

(VIII)

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-Bis(bromophenyl)-4,4',5,5'-tetraphenylbiimidazole,
2,2'-bis(p-carboxyphenyl)-4,4',5,5"-tetraphenylbiimidazole,
2,2'-bis(o-chlorophenyl)-4,4',5,5'-tetrakis(p-methoxyphenyl)biimidazole,
2,2'-bis(p-chlorophenyl)-4,4',5,5'-tetrakis(p-methoxyphenyl)biimidazole,
2,2'-bis(p-cyanophenyl)-4,4'5,5'-tetrakis(p-methoxyphenyl)biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl)biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenylbiimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)biimidazole,
2,2'-di-9-phenanthryl-4,4',5,5'-tetrakis(p-methoxyphenyl)biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benzylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl)biimidazole, and
2,2'-bis(2-chloro-5-sulfophenyl)-4,4',5,5'-tetraphenylbiimidazole,
and especially preferred:
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or 2,2'-bis(o,p-dichlorophenyl)-4,4',5,5'-tetra(o,p-dichlorophenyl)biimidazole;
but the invention is not restricted to these compounds.

Suitable hexaarylbiimidazoles can be prepared according to known methods (see e.g. U.S. Pat. No. 3,445,232). A preferred process is the oxidative dimerization of corresponding triarylimidazoles with iron-(III)-hexacyanoferrate (II) in an alkali solution.

It is irrelevant for the purposes of the present invention which hexaarylbiimidazole isomer (or mixture of isomers) is used (e.g. 1,2'-, 1,1'-, 1,4', 2,2'-, 2,4'- and 4,4'-isomer), as long as it is photodissociable and provides triarylimidazolyl free-radicals in the process.

The trihalogenmethyl compounds suitable as coinitiators are capable of forming free-radicals. Trihalogenmethyl-substituted triazines and trihalogenmethyl-arylsulfones are preferred. The following can be mentioned as examples (without restricting the invention to these compounds):
2-(4-Methoxyphenyl)-4,6-bis(trichloromethyl)-s-triazine,
2-(4-chlorophenyl)-4,6-bis-(trichloromethyl)-s-triazine,
2-phenyl-4,6-bis(trichloromethyl)-s-triazine,
2,4,6-tris-(trichloromethyl)-s-triazine,
2,4,6-tris-(tribromomethyl)-s-triazine and
tribromomethylphenylsulfone.

Many coinitiators can also function as photoinitiators when they are exposed in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In this case, the coinitiator functions as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt.-%, based on the dry layer weight, especially preferred 0.5 to 15 wt.-%.

Further examples of suitable sensitizers and coinitiators for IR-sensitive coatings are also mentioned in WO 2004/041544, WO 2000/48836 and DE 10 2004 003143.

Free-Radical Polymerizable Component

All monomers, oligomers and polymers which comprise at least one non-aromatic C=C double bond can be used as free-radical polymerizable monomers, oligomers and polymers. Monomers/oligomers/polymers with C=C triple bonds can also be used, but they are not preferred. Suitable compounds are well known to the person skilled in the art and can be used in the present invention without any particular limitations. Esters of acrylic and methacrylic acids, itaconic acid, crotonic and isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C=C double bonds in the main or side chains. Examples thereof include reaction products of maleic acid anhydride copolymers and hydroxyalkyl(meth)acrylates (cf. e.g. DE 4 311 738 C1); (meth)acrylic acid polymers, partially or fully esterified with allyl alcohol (cf. e.g. DE 3 332 640 A1); reaction products of polymeric polyalcohols and isocyanatoalkyl(meth)acrylates; unsaturated polyesters; (meth)acrylate-terminated polystyrenes, poly(meth)acrylic acid ester, poly(meth)acrylic acids, poly(meth)acrylamides; (meth)acrylic acid polymers, partially or fully esterified with epoxides comprising free-radical polymerizable groups; polymers with allyl side-groups which can for example be obtained by polymerization of allyl(meth)acrylate, optionally with further comonomers; polymers of (meth)acrylic acid, partially esterified with vinyl alcohol; and polymers of (meth)acrylic acid, partially esterified with ethyleneglycol(meth)acrylate.

Free-radical polymerizable compounds that can be used in the present invention also include compounds that have a molecular weight of 3,000 or less and are reaction products obtained by reacting a diisocyanate with (i) an ethylenically unsaturated compound with one hydroxy group, and at the same time (ii) a saturated organic compound with one NH group and one OH group, wherein the reactants are used in amounts according to the following condition:

Number of moles of isocyanate groups ≦ number of moles of OH plus NH groups.

Examples of diisocyanates are represented by the following formula:

$$O=C=N-(CR^9_2)_a\text{-}D\text{-}(CR^9_2)_b-N=C=O \qquad (IX)$$

wherein a and b independently represent 0 or an integer from 1 to 3, each $R^9$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups and no secondary and primary amino groups.

D can for example be an alkylene group $(CH_2)_w$, wherein w is an integer from 1 to 12, preferably 1 to 6, and one or more hydrogen atoms are optionally replaced with substituents such as e.g. alkyl groups (preferably $C_1$-$C_6$), a cycloalkylene group, an arylene group or a saturated or unsaturated divalent heterocyclic group.

The ethylenically unsaturated compound (i), which comprises a hydroxy group, comprises at least one non-aromatic C=C double bond, which is preferably terminal. The hydroxy group is preferably not bonded to a doubly bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include Hydroxy($C_1$-$C_{12}$)alkyl(meth)acrylates (e.g. 2-hydroxyethyl(meth)acrylate, 2- or 3-hydroxy-propyl(meth)

acrylate, 2-, 3- or 4-hydroxybutyl(meth)acrylate), hydroxy ($C_1$-$C_{12}$)alkyl-(meth)acrylamides (e.g. 2-hydroxyethyl (meth)acrylamide, 2- or 3-hydroxypropyl(meth)-acrylamide, 2-, 3- or 4-hydroxybutyl(meth)acrylamide), mono(meth)acrylates of oligomeric or polymeric ethylene glycols or propylene glycols (e.g. polyethylene glycol mono(meth)acrylate, triethylene glycol mono(meth)acrylate), allyl alcohol, pentaerythritol tri(meth)acrylate, 4-hydroxy($C_1$-$C_{12}$)alkyl-styrene (e.g. 4-hydroxymethylstyrene), 4-hydroxystyrene, hydroxycyclo-hexyl(meth)acrylate.

The term "(meth)acrylate" and the like as used throughout the present invention indicates that both methacrylate and acrylate etc. are meant.

The saturated organic compound (ii) is a compound with one OH and one NH group.

The saturated organic compound (ii) can for example be represented by the following formula (X) or (XI)

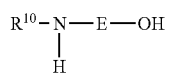  (X)

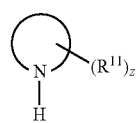  (XI)

wherein $R^{10}$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group,

represents a saturated heterocyclic ring with 5 to 7 ring atoms, which in addition to the nitrogen atom shown above optionally comprises another heteroatom selected from S, O and $NR^{12}$, wherein $R^{12}$ is an alkyl group optionally substituted with an OH group, $R^{11}$ is OH or a straight-chain, branched or cyclic alkyl group substituted with an OH group, and z=0 if the heterocyclic ring comprises $NR^{12}$ and $R^{12}$ is an alkyl group substituted with OH and z=1 if the saturated heterocyclic ring does not comprise $NR^{12}$ or if the saturated heterocyclic ring comprises $NR^{12}$ and $R^{12}$ is an unsubstituted alkyl group.

The number of moles of isocyanate groups must not exceed the number of moles of OH groups and NH groups combined since the product should not comprise any more free isocyanate groups.

Additional suitable C—C unsaturated free-radical polymerizable compounds are described e.g. in EP 1 176 007 A2.

It is of course possible to use a mixture of different kinds of monomers, oligomers or polymers; furthermore, mixtures of monomers and oligomers and/or polymers can be used in the present invention, as well as mixtures of oligomers and polymers.

The free-radical polymerizable component is preferably used in an amount of 5 to 95 wt.-%, based on the dry layer weight, especially preferred 10 to 85 wt.-%.

Optional Components of the Free-Radical Polymerizable Coating

Independently of whether the element is UV/VIS- or IR-sensitive, the photopolymerizable coating can comprise one or more of the following optional components in addition to the essential components. If the coating consists of several layers, the optional component can be present in one, several or all of the layers. Dyes or pigments having a high absorption in the visible spectral range can be present in order to increase the contrast ("contrast dyes and pigments"). Particularly suitable dyes and pigments are those that dissolve well in the solvent or solvent mixture used for coating or are easily introduced in the disperse form of a pigment. Suitable contrast dyes include inter alia rhodamine dyes, triarylmethane dyes such as Victoria blue R and Victoria blue BO, crystal violet and methyl violet, anthraquinone pigments, azo pigments and phthalocyanine dyes and/or pigments. The colorants are preferably present in an amount of 0 to 15 wt.-%, more preferred 0.5 to 10 wt.-%, particularly preferred 1.5 to 7 wt.-%, based on the dry layer weight.

Furthermore, the layer(s) can comprise surfactants (e.g. anionic, cationic, amphoteric or non-ionic tensides or mixtures thereof). Suitable examples include fluorine-containing polymers, polymers with ethylene oxide and/or propylene oxide groups, sorbitol-tri-stearate and alkyl-di-(aminoethyl)-glycines. They are preferably present in an amount of 0 to 10 wt.-%, based on the dry layer weight, more preferred 0.1 to 5 wt.-%, especially preferred 0.2 to 1 wt.-%.

The layer(s) can furthermore comprise print-out dyes such as crystal violet lactone or photochromic dyes (e.g. spiropyrans etc.). They are preferably present in an amount of 0 to 15 wt.-%, based on the dry layer weight, especially preferred 0.5 to 5 wt.-%.

Also, flow improvers can be present in the layer(s), such as poly(glycol)ether-modified siloxanes; they are preferably present in an amount of 0 to 1 wt.-%, based on the dry layer weight.

The layer(s) can furthermore comprise antioxidants such as e.g. mercapto compounds (2-mercapto-benzimidazole, 2-mercaptobenzthiazole, 2-mercaptobenzoxazole and 3-mercapto-1,2,4-triazole), and triphenylphosphate. They are preferably used in an amount of 0 to 15 wt.-%, based on the dry layer weight, especially preferred 0.5 to 5 wt.-%.

Other coating additives can of course be present as well.

Overcoat

An overcoat is applied over the photopolymerizable coating for protecting the coating from atmospheric oxygen during storage, exposure and in particular during the time between exposure and further processing. During that time the overcoat has to exhibit sufficient adhesion to the light-sensitive coating so that safe handling (manufacture, packing, transport, exposure etc.) is guaranteed without tearing of the layers. In addition to its function as oxygen barrier layer the overcoat also protects the photopolymerizable coating from fingerprints and mechanical damage like scratches.

A number of water-soluble polymers are described in the literature as being suitable for such overcoats. Suitable examples are polyvinyl alcohol, partly saponified polyvinyl acetate which can also contain vinylether and vinylacetal units, polyvinyl pyrrolidone and copolymers thereof with vinyl acetate and vinyl ethers, hydroxy alkyl cellulose, gelatin, polyacrylic acid, gum arabic, polyacryl amide, dextrin, cyclodextrin, copolymers of alkylvinyl ethers and maleic acid anhydride as well as water-soluble high molecular polymers of ethylene oxide having molecular weights of above 5,000 are particularly suitable. Polyvinyl alcohol is a preferred overcoat polymer. Also polyvinyl alcohol in combination with poly(1-vinylimidazole) or a copolymer of 1-vinyl-imidazole and at least one further monomer as described in WO 99/06890 can be used.

Polyvinyl alcohol can also be used in combination with polyvinyl pyrrolidone as adhesive.

Overcoats are also described in U.S. Pat. No. 3,458,311, U.S. Pat. No. 4,072,527, U.S. Pat. No. 4,072,528, EP 275 147 A1, EP 403 096 A1, EP 354 475 A1, EP 465 034 A1 and EP 352 630 A1.

In a preferred embodiment the overcoat comprises polyvinyl alcohol or polyvinyl alcohol in combination with poly(1-vinylimidazol) (or a copolymer thereof).

Suitable polyvinyl alcohols are commercially available at inexpensive prices. They usually have a residual content of acetate groups in the range of 0.1 to 30 wt.-%. Especially preferred are polyvinyl alcohols obtained from polyvinylacetate with a residual acetate content of 1.5 to 22 wt.-%. By means of the molecular weight of the used polyvinyl alcohols, adhesion and water-solubility of the overcoats according to the present invention can be controlled. A lower molecular weight promotes the removal of the overcoat with aqueous solutions.

The water-soluble overcoats can be applied by means of surface coating methods known to the skilled practician such as doctor blade coating, roller coating, slot coating, curtain coating, spray or dipping processes. Dry layer weights of from 0.05 to 10 g/m$^2$, more preferably 0.2 to 3 g/m$^2$, most preferably 0.3 to 1 g/m$^2$ are suitable.

In many cases it is favorable to apply the water-soluble overcoats in an aqueous solution. This has the least detrimental effects on the environment and the human body.

For some applications, however, it can also be favorable to use organic solvents. In some substrates the addition of 0.5 to 60 wt.-% of an organic solvent to the aqueous coating solution improves adhesion. By means of a slight solvation of the surface to be overcoated, the adhesive effect of the polymers of the overcoats according to the present invention is increased further. Such additives to solvents can e.g. be alcohols or ketones.

For a uniform and rapid wetting of the surface to be coated, anionic, cationic or non-ionic wetting agents may be added to the coating solutions. The overcoat furthermore can comprise stabilizers, preservatives, dyeing agents, foam separators and rheological additives.

Processing Liquid

The processing liquid used in the method of the present invention is an aqueous alkaline solution having a pH value of 9.5 to 14.

Water

Tap water, deionized water or distilled water can be used. The amount of water is preferably in the range of 45 to 95 wt.-%, based on the total weight of the processing liquid, especially preferred 50 to 90 wt.-% and particularly preferred 55 to 85 wt.-%

Alkaline Component

The alkaline component is selected from alkali silicates, alkali hydroxides, $Na_3PO_4$, $K_3PO_4$, $NR_4OH$, wherein each R is independently selected from $C_1$-$C_4$ alkyl groups and $C_1$-$C_4$ hydroxyalkyl groups, and mixtures of 2 or more thereof.

The amount of the alkaline component, or in case of mixtures the total amount of the alkaline components, is selected such that the pH value of the processing liquid is 9.5 to 14, preferably, the pH is in the range of 10.5 to 13.

As used in the present invention, the term "alkali silicates" also encompasses metasilicates and water glasses. Sodium silicates and potassium silicates are preferred silicates. When alkali silicates are used, the amount of silicate is preferably at least 1 wt.-% (calculated as $SiO_2$), based on the processing liquid.

Of the alkali hydroxides, NaOH and KOH are especially preferred.

Usually the use of alkali metasilicates readily provides a pH value of more than 12 without further alkaline additives such as e.g. alkali hydroxide. When water glass is used, an alkali hydroxide is used in addition if a pH value of more than 12 is desired.

Preferred quaternary ammonium hydroxides $NR_4OH$ include for example tetramethyl ammonium hydroxide, trimethylethanol ammonium hydroxide, methyltriethanol ammonium hydroxide and mixtures thereof; an especially preferred ammonium hydroxide is tetramethyl ammonium hydroxide.

Surfactant

The surfactant is not specifically limited as long as it is compatible with the other components of the processing liquid and soluble in aqueous alkali solutions with a pH of 9.5 to 14. The surfactant can be a cationic, an anionic, an amphoteric or a nonionic one.

Examples of anionic surfactants include aliphates, abietates, hydroxyalkanesulfonates, alkylsulfonates, dialkylsulfosuccinates, straight-chain alkylbenzenesulfonates, branched alkylbenzenesulfonates, alkylnaphthalenesulfonates, alkylphenoxypolyoxyethylenepropyl-sulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, naphthalenesulfonateformalin condensates, sodium dodecylphenoxybenzene disulfonates, the sodium salts of alkylated naphthalenesulfonate, disodium methylene-dinaphtalene-disulfonate, sodium dodecyl-benzenesulfonate, (di)sulfonated alkyldiphenyloxides, ammonium or potassium perfluoroalkylsulfonates and sodium dioctyl-sulfosuccinate.

Particularly preferred among these anionic surfactants are alkylnaphthalenesulfonates, disulfonated alkyldiphenyloxides, and alkylsulfonates.

Suitable examples of the nonionic surfactants include polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycol-monoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers and polyoxyethylene-polyoxypropylene block polymers.

Further, fluorinic and siliconic anionic and nonionic surfactants may be similarly used.

Preferred nonionic surfactants are polyoxyethylene and/or polyoxypropylene alkyl ethers.

Amphoteric surfactants are for example N-alkylamino acid triethanol ammonium salts, cocamidopropyl betaines, cocamidoalkyl glycinates, sodium salt of a short chain alkylaminocarboxylate, N2-hydroxyethyl-N2-carboxyethyl fatty acid amidoethylamin sodium salts, and carboxcylic acid amidoetherpropionates; preferred are cocamidopropylbetaines.

Examples of cationic surfactants are tetraalkyl ammoniumchlorides like tetrabutyl ammoniumchloride and tetramethyl ammoniumchloride, and polypropoxylated quaternary ammonium chlorides.

Nonionic, anionic and amphoteric surfactants as well as mixtures thereof are preferred.

Two or more of the above surfactants may be used in combination. The amount of the surfactant (or total amount of surfactants if more than one is used) is not specifically limited but is preferably from 0.01 to 20 wt.-%, more preferably from 2 to 8 wt.-% based on the total weight of the processing liquid.

Film Forming Polymer

Another essential component of the processing liquid is the water-soluble film forming hydrophilic polymer.

Examples of suitable polymers are gum arabic, pullulan, cellulose derivatives such as carboxy-methylcelluloses, carboxyethylcelluloses or methylcelluloses, starch derivatives like (cyclo)dextrins, poly(vinyl alcohol), poly(vinyl pyrrolidone), polyhydroxy compounds like polysaccharides, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid and acrylamidopropane sulfonic acid, polyhydroxy compounds and starch derivatives.

Polyhydroxy compounds and starch derivatives are especially preferred. The starch derivative should be water-soluble, preferably cold-water-soluble and is selected from starch hydrolysis products such as dextrins and cyclodextrins, starch esters, such as phosphate esters and carbamate esters, starch ethers, such as e.g. cationic starch ethers and hydroxypropyl ethers, carboxymethyl starch and acetylated starch; from the above derivatives dextrins (including dextrin comprising sodium tetraborate and available as borax dextrin from Emsland Stärke GmbH) are preferred.

The starch used as a starting product for the starch derivatives can be of various origins, it can e.g. be obtained from corn, potatoes, rye, wheat, rice, manioc, tapioca, chestnuts or acorns; corn starch and potato starch are preferred.

Suitable water-soluble polyhydroxy compounds can be represented by the following structure:

$$R^1(CHOH)_nR^2$$

in which n is 4 to 7; and either (i) $R^1$ is hydrogen, aryl, or $CH_2OH$; and $R^2$ is hydrogen, an alkyl group having 1 to 4 carbon atoms, $CH_2OR^3$ in which $R^3$ is hydrogen or an alkyl group having 1 to 4 carbon atoms, $CH_2N(R^4R^5)$ in which $R^4$ and $R^5$ are each independently hydrogen or an alkyl group having 1 to 4 carbon atoms, or $CO_2H$, or (ii) $R^1$ and $R^2$ together form a carbon-carbon single bond.

In one group of polyhydroxy compounds, $R^1$ is hydrogen or $CH_2OH$ and $R^2$ is hydrogen. In a preferred group of these polyhydroxy compounds, n is 5 or 6. This group includes the sugar alcohols, compounds of the structure $H(CHOH)_nH$, which do not carry a free aldehyde or ketone group and do not show a reducing property. The sugar alcohols may be obtained from natural sources or prepared by hydrogenation of reducing sugars. Preferred sugar alcohols include mannitol, sorbitol, xylitol, ribitol, and arabitol. Other sugar alcohols include, for example, talitol, dulcitol, and allodulcitol.

In another group of polyhydroxy compounds, $R^1$ and $R^2$ together form a carbon-carbon single bond. Included are carbocyclic compounds of the structure: $(CHOH)_n$, in which n is 4 to 7. In a preferred group of these polyhydroxy compounds, n is 5 or 6, more preferably 6. There are nine possible stereoisomers of 1,2,3,4,5,6-hexahydroxycyclohexane, several of which are naturally occurring. A preferred polyhydroxy compound is meso-inosit (cis-1,2,3,5-trans-4,6-hexahydroxycyclohexane). meso-Inosit can be isolated from corn steep liquor.

In another group of polyhydroxy compounds, $R^1$ is hydrogen, aryl, or $CH_2OH$; and $R^2$ is an alkyl group having 1 to 4 carbon atoms, $CH_2OR^3$ in which $R^3$ is an alkyl group having 1 to 4 carbon atoms, $CH_2N(R^4R^5)$ in which $R^4$ and $R^5$ are each independently H or an alkyl group having 1 to 4 carbon atoms, or $CO_2H$.

In another group of polyhydroxy compounds, $R^1$ is hydrogen or $CH_2OH$; and $R^2$ is $CO_2H$. More preferably, $R^1$ is H and n is 4 or 5. This group includes polyhydroxy compounds of the structure $H(CHOH)_nCO_2H$, in which n is 4 or 5. Conceptually, these polyhydroxy compounds may be produced by oxidation of the corresponding hexose or pentose sugar, i.e., oxidation of the aldehyde group of a hexose sugar such as glucose, galactose, allose, mannose, etc., or oxidation of the aldehyde of a pentose sugar such as arabinose, ribose, xylose, etc.

Particularly preferred polyhydroxy compounds are the sugar alcohols mentioned above, like sorbitol.

The amount of the film forming polymer is not specifically limited; preferably it is from 1 to 30 wt.-% based on the total weight of the processing liquid, more preferably from 5 to 20 wt.-%.

Optional Components of the Processing Liquid

Besides the essential components (i.e. surfactant, film forming hydrophilic polymer and alkaline compound) the processing liquid used in the present invention may contain further additives like organic solvents, biocides, complexing agents, buffer substances, dyes, antifoaming agents, odorants, anticorrosive agents and radical inhibitors.

Suitable antifoaming agents include e.g. the commercially available Silicone Antifoam Emulsion SE57 (Wacker), TRITON® CF32 (Rohm & Haas), AKYPO® LF (ethercarboxylic acid Chem Y), Agitan 190 (Münzing Chemie), TEGO®

Foamese 825 (modified polysiloxane, TEGO Chemie Service GmbH, Germany). Silicone-based antifoaming agents are preferred. They are either dispersible or soluble in water. The amount of antifoaming agent in the processing liquid is preferably 0 to 1 wt.-%, based on the weight of the processing liquid especially preferred 0.01 to 0.5 wt.-%. One antifoaming agent or a mixture of two or more can be used.

Suitable buffer substances include e.g. tris(hydroxymethyl)-aminomethane (TRIS), hydrogen phosphates, glycine, 3-(cyclohexylamino)-propane sulfonic acid (CAPS), hydrogen carbonates, borates including borax, 2-amino-2-methyl-1-propanol (AMP), 3-(cyclohexylamino)-2-hydroxy-1-propane-sulfonic acid (CAPSO), and 2-(N-cyclohexylamino)ethan-sulfonic acid (CHES).

The biocides should be effective against bacteria, fingi and/or yeasts. Suitable biocides include e.g. N-methylolchloroacetamide, benzoic acid, phenol or its derivatives, formalin, imidazol derivatives, isothiazolinone derivatives, benzotriazole derivatives, amidines, guanidine derivatives, quaternary ammonium salts, pyridine, quinoline derivatives, diazine, triazole derivatives, oxazole and oxazine derivatives and mixtures thereof. Their amount is not particularly restricted and preferably accounts for 0 to 10 wt.-% in the processing liquid, based on the total weight of the solution, especially preferred 0.1 to 1 wt.-%. One biocide or a mixture of two or more can be used.

Examples of suitable complexing agents include: Aminopolycarboxylic acid and salts thereof, such as ethylene diamine tetraacetic acid and potassium or sodium salts thereof, diethylene triamine pentaacetic acid and potassium or sodium salts thereof, triethylene tetramino-hexaacetic acid and potassium or sodium salts thereof, hydroxyethyl ethylene diamine triacetic acid and potassium or sodium salts thereof, nitrilotriacetic acid and potassium or sodium salts thereof, 1,2-diaminocyclohexane-tetraacetic acid and potassium or sodium salts thereof and 1,3-diamino-2-propanol-tetraacetic acid and potassium or sodium salts thereof, and an organophosphonic acid, phosphonoalkane tricarboxylic acid or salts thereof, such as 2-phosphonobutane-1,2,4-tricarboxylic acid and potassium or sodium salts thereof, phosphonobutane-2,3,4-tricarboxylic acid and potassium or sodium salts thereof, phosphonoethane-2,2,2-tricarboxylic acid and potassium or sodium salts thereof, aminotris-(methylene-phosphonic acid) and potassium or sodium salts thereof and sodium gluconate. The complexing agents can be used individually or as a combination of two or more. Organic amine salts of the above-mentioned complexing agents can be used instead of the potassium or sodium salts thereof. The amount of complexing agent preferably accounts for 0 to 5 wt.-% in the processing liquid, based on the total weight of the solution, especially preferred 0.01 to 1 wt.-%.

The processing liquid may also comprise an organic solvent or a mixture of organic solvents. The processing liquid is a single phase. Consequently, the organic solvent must be miscible with water, or at least soluble in the processing liquid to the extent it is added to the processing liquid, so that phase separation does not occur. The following solvents and mixtures of these solvents are suitable for use in the processing liquid: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent is typically present in the processing liquid at a concentration of between about 0 wt.-% to about 15 wt.-%, based on the weight of the processing liquid preferably between about 3 wt.-% and about 5 wt.-%, based on the weight of the processing liquid.

As described in detail in U.S. Pat. No. 6,383,717 B1 and U.S. Pat. No. 6,482,578 B2 sludge may be formed in a developer bath due to the build up of free-radical polymerizable material. Sludge formation may be prevented by the presence of at least one material selected from filter dyes and free-radical inhibitors in the processing liquid. Filter dyes absorb ambient ultraviolet and visible radiation and reduce the amount absorbed by the radiation-sensitive initiator system present in the loaded processing liquid. Free-radical inhibitors inhibit free-radical polymerization of the monomer in the loaded processing liquid.

The absorption of the filter dye is matched to the absorption of the radiation-sensitive initiator system, furthermore the filter dye should be stable in the processing liquid and should not undergo any chemical reaction or interaction with the components of the processing liquid, or the radiation-sensitive layer.

The concentration of filter dye required to produce the stabilizing effect under daylight or similar conditions will depend on the number of factors; however, the concentration of the filter dye is preferably about 0 to 2 wt.-%, based on the weight of the processing liquid, preferably about 0.4% to 2 wt.-%, based on the weight of the processing liquid.

The filter dye must be sufficiently soluble in the processing liquid that enough filter dye can be dissolved in the processing liquid to absorb radiation in the region about 350 nm to about 650 nm region of the spectrum. Dyes substituted with one or more sulfonic acid groups will typically have sufficient solubility in the developer. Preferred dyes include yellowish, yellow, orange and red dyes substituted with sulfonic acid groups. Especially preferred are sulfonated azo dyes. Suitable dyes include, for example, metanil yellow (C.I. 13065) and other similar water-soluble azo dyes, such as, for example, methyl orange (C.I. 13025), tropaeoline 0 (C.I. 14270), tropaeoline OO(C.I. 13080), tartrazine (C.I. 19140); Oxonol Yellow K (Riedel-de-Haen); dyes of the acid yellow type, such as C.I. 13900, C.I. 14170, C.I. 18835, C.I. 18965, C.I. 18890, C.I. 18900, C.I. 18950 (polar yellow), C.I. 22910, and C.I. 25135; and dyes of the acid red type, such as C.I. 14710, C.I. 14900, C.I. 17045, C.I. 18050, C.I. 18070, and C.I. 22890. Other suitable dyes will be readily apparent to those skilled in the art. A single filter dye or a mixture of filter dyes can be used.

Suitable free-radical inhibitors, also known as polymer stabilizers or free-radical traps, are well known in the art of monomer and polymer stabilization.

Any material that is capable of reacting with free-radicals to form products that do not initiate polymerization of the monomer, that has the necessary solubility and stability in the processing liquid, and that does not adversely affect the properties of either the processing liquid or the printing plate can potentially be used. They include, for example: compounds containing quinone or hydroquinone moieties, especially benzoquinone and substituted benzoquinones, and hydroquinone and substituted hydroquinones, such as hydroquinone monomethyl ether (4-methoxyphenol), t-butylhydroquinone (4-t-butylphenol, TBHQ), and t-butyl hydroxyanisol (BHA); recorcinol, pyrrogallol, phosphate esters; and hindered phenols and bisphenols, such as 2,6-di-t-butyl-4-methylphenol (BHT), and 2,6-di-t-butyl-4-methoxyphenol, 2,4,6-tri-t-butylphenol; stable free-radicals, such as di-t-butyl nitroxide and 2,2,6,6-tetramethyl-4-pyridone nitroxide; nitro substituted aromatics; amino phenols; phenothiazine; and secondary diaryl amines such as substituted diphenyl amines, N,N'-diphenyl-p-phenylenediamine, and N-phenyl-naphthyl amine. Preferred radical inhibitors are quinones, hydroquinones, ethers of hydroquinones, and hindered phenols. More preferred are ethers of hydroquinones, especially ethers of hydroquinone and hindered phenols. Preferred compounds are hydroquinone monomethyl ether (4-methoxyphenol), 2,6-di-t-butyl-4-methylphenol, and 2,4,6-tri-t-butylphenol. A single free-radical inhibitor or a mixture of free-radical inhibitors can be used. The free-radical inhibitor or a mixture of free-radical inhibitors is typically present in the processing liquid at a concentration of about 0 wt.-% to about 3.0 wt.-% based on the weight of the processing liquid, preferably about 0.5 wt.-% to about 1.5 wt.-%, based on the weight of the processing liquid.

Examples of anticorrosive agents are phosphonic acids and their salts like hydroxyethyl phosphonic acid and its salts, amino trismethylene phosphonic acid and its salts, and diethylentriaminpentamethylene phosphonic acid and its salts; phosphates like trisodium phosphate; borates like borax; as well as glycerol and glycols having the formula

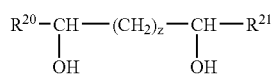

(wherein z is 0, 1 or 2 and $R^{20}$ and $R^{21}$ are independently hydrogen or $C_1$-$C_3$ alkyl).

The anticorrosive agent or mixture of such agents is typically present in the processing liquid at a concentration of about 0 to 10 wt.-% based on the weight of the processing liquid, preferably 0.1 to 5 wt.-%, in case of glycerol or a glycol 5 to 10 wt.-%.

Imagewise Exposure

If the absorber component used in the photopolymerizable coating absorbs UV/VIS radiation, the precursors are imagewise exposed in a manner known to the person skilled in the art with UV/VIS radiation of a wavelength of 250 to 750 nm. For this purpose, common lamps, such as carbon arc lamps, mercury lamps, xenon lamps and metal halide lamps, or lasers or laser diodes can be used. UV laser diodes emitting UV radiation in the range of about 405 nm (e.g. 405±10 nm), argon ion lasers emitting in the visible range (488 nm or 514 nm) and frequency-doubled fd:Nd:YAG lasers emitting at around 532 nm are of particular interest as a radiation source. The laser radiation can be digitally controlled via a computer, i.e. it can be turned on or off so that an imagewise exposure of the plates can be effected via stored digitized information in the computer; this way, so-called computer-to-plate (ctp) printing plates can be obtained.

If the absorber component absorbs IR radiation, i.e. noticeably absorbs radiation of a wavelength in the range of more than 750 to 1,200 nm, and preferably shows an absorption maximum in this range in its absorption spectrum, imagewise exposure can be carried out with IR radiation sources. Suitable radiation sources are e.g. semi-conductor lasers or laser diodes which emit in the range of 750 to 1200 nm, for example Nd:YAG lasers (1,064 nm), laser diodes which emit between 790 and 990 nm, and Ti:sapphire lasers. The laser radiation can be digitally controlled via a computer, i.e. it can be turned on or off so that an imagewise exposure of the plates can be effected via stored digitized information in the computer; this way, so-called computer-to-plate (ctp) printing plates can be obtained. Any image-setters equipped with IR lasers that are known to the person skilled in the art can be used.

The imagewise exposed precuror comprises exposed and unexposed areas of the coating.

Processing of the Exposed Precursor

After exposure the precursor is treated with the processing liquid without any pre-wash step which is usually carried out for removing the overcoat. According to one embodiment a preheat step is carried out between exposure and treating with the processing liquid. By treating the exposed precursor with the processing liquid the overcoat is removed in the exposed and unexposed areas, the non-exposed areas of the radiation-sensitive coating are removed and the developed precursor is provided with a protective gumming in one single step.

While usually the precursor is rinsed with water after treatment with an alkaline developer before a usually acidic gumming solution is applied, such a rinsing step is not carried out according to the process of the present invention. Furthermore, according to the method of the present invention no gumming step is carried out after having treated the exposed precursor with the processing liquid.

Typically, the exposed precursor is contacted with the processing liquid by rubbing or wiping the imageable layer with an applicator containing this liquid. Alternatively, the exposed precursor may be brushed with the processing liquid or the processing liquid may be applied to the precursor by spraying. The treatment with the processing liquid can also be carried out by immersing the exposed precursor in a bath of the processing liquid. In either instance, a developed and gummed plate without overcoat is produced. Preferably, the processing may be carried out in a commercially available processor, such as TDP 60 (Kodak Polychrome Graphics) which contains only one bath for the processing liquid and a drying section. Additionally, a conductivity-measuring unit can be incorporated into the processor.

Although conventional processors equipped with an immersion type developing bath, a section for rinsing with water, a gumming section, and a drying section, can be used, the rinsing step and gumming step are not carried out according to the process of this invention. It is an advantage of the present invention that simple processors containing only one bath and a drying section can be used since such processors are much smaller and cheaper than processors with rinsing and gumming sections and therefore save space and money. Additionally, a conductivity-measuring unit can be incorporated into the processor for controlling the developer activity of the processing liquid.

The exposed precursor is typically treated with the processing liquid at a temperature of 18° C. to about 28° C., for a period of about 5 seconds to about 60 seconds.

After a certain number of exposed precursors have been processed, the developing activity (for instance measured by titration or conductivity measurement) of a bath of the processing liquid falls below a predetermined level. Then fresh processing liquid is added to the processing bath (also called "top-up" process). Usually about 30 mL to about 100 mL, typically about 50-80 mL, of fresh processing liquid per 1 m² of precursor processed is necessary to keep both the volume of processing liquid and its activity/conductivity value constant. The processed lithographic printing plate, comprises regions in which imageable layer has been removed revealing the underlying surface of the hydrophilic substrate, and complimentary regions in which the imageable layer has not been removed. The regions in which the imageable layer has not been removed are ink receptive.

Instead of adding fresh processing liquid for keeping the activity of the processing bath constant a replenisher can be added. The replenisher suitably differs from the fresh processing liquid in that the concentration of the alkaline reagent is higher compared to the concentration of the alkaline reagent in the fresh processing liquid used; the concentration of the other components might be the same or higher as in the fresh processing liquid.

After having contacted the precursor with the processing liquid any excess of said processing liquid remaining on the precursor is removed (for instance by means of squeeze rollers); this removing step does not consist of or comprise washing/rinsing the precursor with a liquid (like water etc.). After a subsequent optional drying step the processed precursor is transferred to the press. On the press the processed precursor is contacted with fountain solution and printing ink, either simultaneously or subsequently (in any order, but preferably first fountain solution and thereafter ink). By contacting the precursor with the fountain solution and ink and thereafter with paper any remainders of undesired coating (radiation-sensitive coating in the non-image areas and/or overcoat) which have not already been removed by the treatment with the processing liquid are removed. The process of the present invention can therefore be interpreted as a combination of "conventional developing" (i.e. removing the unexposed areas of the radiation-sensitive coating by means of an aqueous developer solution) by treatment with the processing liquid and on-press developing; in this invention the treatment with the processing liquid not only removes unexposed areas of the radiation sensitive coating but in a single step also removes the overcoat and provides gumming so that separate steps of overcoat wash-off, rinsing and separate gumming are avoided.

The present invention is described in more details in the following examples; however they are not intended to restrict the invention in any way.

EXAMPLES

The following abbreviations are used:
Desmodur® 100 trifunctional isocyanate (biuret of hexamethylene diisocyanate), available from Bayer,
Basonyl Violet 610 triarylmethane dye from BASF
HEA (2-hydroxyethyl)acrylate
HEMA (2-hydroxyethyl)methacrylate
HEPi 2-(2-hydroxyethyl)-piperidine
HMDI hexamethylene diisocyanate
Ioncryl 683 acrylic resin from SC Johnson & Son Inc. USA, acid number=162 mg KOH/g
IR dye 66e IR absorbing cyanine dye available from FEW Chemicals GmbH

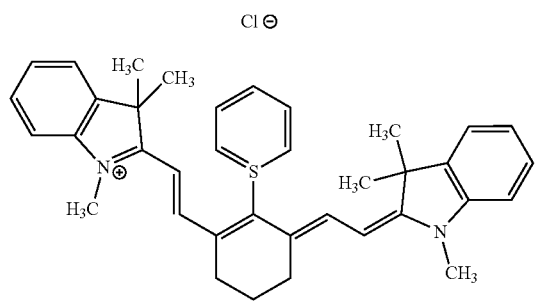

Kayamer PM-2 ester of 1 mol phosphoric acid and 1.5 mol hydroxyethylmethacrylate, available from Nippon Kayaku
NEKAL® Paste anionic surfactant (alkylnaphthalene sulfonic acid, sodium salt), available from BASF
NK Ester BPE 500 ethoxylated Bisphenol A dimethacrylate, available from Shin Nakamura Ltd.
NK Ester BPE-200 ethoxylated Bisphenol A dimethacrylate, available from Shin Nakamura Ltd.
PETA pentaerythritol triacrylate
PC1199 nonionic surfactant (ethoxylated/propoxylated $C_{10}$-$C_{12}$ alcohol), available from Polygon
Renolblue B2G-HW® copper phthalocyanine pigment dispersed in polyvinyl butyral, available from Clariant
REWOPOL® NLS 28 anionic surfactant (sodium lauryl sulfate), available from REWO
TEXAPON® 842 anionic surfactant (sodium octyl sulfate), available from Henkel
Amphotensid B5 amphoteric surfactant (cocamidopropyl betaine), available from Zschimmer & Schwarz GmbH
Dowfax 2A1 anionic surfactant (sodium dodecyl diphenyloxide disulfonate, 45%), available from Dow Chemicals
Surfynol 465 nonionic surfactant (ethoxylated 2,4,7,9-tetramethyl-5-decyne-4,7-diol), available from Airproducts
Dowfax 8390 anionic surfactant (sodium n-hexadecyl diphenyloxide disulfonate, 35%), available from Dow Chemicals
Mergal K7 preservative (methylchloro-isothiazolinone), available from Troy
Sorbidex 200 99% D-sorbitol, available from Ceresda
Emdex 30 AN 45 dextrine from potato starch, soluble in cold water, available from Emsland Stärke GmbH Examples 1-10 and Comparative Examples 1-15

An electrochemically grained and anodized aluminum foil that was subjected to an after-treatment using an aqueous solution of polyvinyl phosphonic acid (PVPA) was coated with a composition as shown in any of Tables 1 to 6 after filtering the solution. The plates were dried for 4 minutes at 90° C.; the dry coating weight obtained is shown in Table 1.

The obtained samples were overcoated with an aqueous solution of poly(vinyl alcohol) (Celvol 203 from Airproducts, having a hydrolysis degree of 88%) to get a printing plate precursor having a dry coating weight of the overcoat as summarized in Table 1 after drying for 4 minutes at 90° C.

Exposure of plates 1 to 5 was carried out as follows:
The UGRA/FOGRA Postscript Strip version 2.0 EPS (available from UGRA), which contains different elements for evaluating the quality of the copies, was used for imaging plates #2 and #3 with Trendsetter 3244 from Creo (830 nm).
Printing plates #1 and #4 were exposed with an imagesetter (Andromeda® A750M from Lithotech), equipped with a laser diode emitting at 405 nm (P=30 mW, cw). An UGRA gray scale V2.4 with defined tonal values (all data were linearized in order to approximately obtain the desired tonal value) was exposed onto the plate precursor described above. Additionally, the sensitivity of the plate was determined using an UGRA Offset test scale 1982 with overall exposure.
Printing plate #5 was exposed with a Theimer vacuum frame equipped with a Ga-doped Hg-lamp using UGRA Offset test scale 1982.

Further processing of the plates was as follows:
Sample number 1, 2 and 5 were preheated directly after exposure.
All plates were directly treated in a TDP 60 (Kodak Polychrome Graphics) single bath processor equipped with 2 scrub brush rollers with processing liquids as shown in Table 7 (in Table 7 "CD" indicates a comparative processing liquid) without any washing step before said treatment. Excess liquid was removed by the exit squeeze rollers and the plates were dried with warm air; no additional washing step and gumming step was performed.

The thus prepared plates were loaded in a sheet-fed offset printing machine using fountain solution and an abrasive ink (Offset S 7184 available from Sun Chemical which contains 10% of calcium carbonate). The image free areas were checked for scumming. If the plate did not clean up in less than 100 copies, the press test was stopped prematurely at 1000 copies. Otherwise up to 20 000 copies were made but, unless noted otherwise, the print run could have continued.

The following tests were carried out:

Developability:

For assessment of the developability unexposed plate stripes of 5×30 cm² were dipped into the corresponding developer being placed in a glass beaker and every 5 sec the stripes were lowered 4 cm deeper into the developer. Prior to this, plates #1, #2 and #5 were treated for 2 min in an oven at 90° C. After a total of 50 sec the stripes were pulled out of the developer, rinsed with water and the time to get the first clean step was noted as the developing time.

Photosensitivity of Plates Sensitive to Radiation of 405 nm (Plates #1, #4 and #5):

Photospeed of plates exposed at 405 nm was evaluated under flood light using the platesetter disclosed above. The photospeed measured for such plates is the energy needed in order to obtain two gray scale steps of an UGRA scale after developing.

Photosensitivity of Plates Sensitive to Radiation of 830 nm (Plates #2 and #3):

Photospeed of plates exposed at 830 nm (formulation disclosed in Table 3) was evaluated by exposing the plate with different energies. The minimum energy needed in order to obtain a clear image of all microstructure elements after developing was taken as a quantity related to the photosensitivity of such a system.

Roll Up:

The number of sheets required before a clean image was printed was counted. When less than 20 sheets were needed, the performance was considered satisfactory.

The results of the above tests can be derived from Table 8.

TABLE 2

| | |
|---|---|
| 6.48 g | copolymer made of methyl methacrylate and methacrylic acid dissolved in propylene glycol monomethyl ether resulting in a 27.9 wt.-% solution showing an acid number of 85 |
| 1.12 g | of a dispersion in propylene glycol monomethyl ether containing 7.25 wt.-% of copper phthalocyanine and 7.25 wt.-% of a polyvinylacetal binder containing 39.9 mol % vinyl alcohol, 1.2 mol % vinylacetate, 15.4 mol % acetal groups derived from acetaldehyde, 36.1 mol % acetal groups derived from butyraldehyde and 7.4 acetal groups derived from 4-formylbenzoic acid |
| 0.08 g | Kayamer PM-2 |
| 10.98 g | a solution of 30 wt.-% in methyl ethyl ketone of an oligomer made by reaction of HMDI + HEMA + HEPi |
| 0.6 g | NK Ester BPE 500 |
| 1.12 g | 2-phenyl-4-(2-chlorophenyl)-5-(4-diethylaminophenyl)-oxazole |
| 0.273 g | 2,2-bis-(-2-chlorophenyl)-4,5,4',5'-tetraphenyl-2'H-[1,2']biimidazolyl |
| 0.497 g | mercapto-3-triazol |
| 36 ml | propylene glycol monomethyl ether |
| 24 ml | methanol |
| 29 ml | methyl ethyl ketone |

TABLE 3

| | |
|---|---|
| 4.26 g | of a 30% propylene glycol mono methyl ether solution of a terpolymer prepared by polymerization of 470 parts by wt. styrene, 336 parts by wt. methyl methacrylate and 193 parts by wt. methacrylic acid |
| 1.26 g | Ioncryl 683 |
| 9 g | a solution of 30 weight % in methyl ethyl ketone of an oligomer made by reaction of Desmodur N100 with HEMA and PETA |
| 0.10 g | anilino diacetic acid |
| 0.30 g | 2-(4-methoxyphenyl)4.6-trichlormethyl- 1,3,5-triazin |
| 0.075 g | Basonyl Violet 610 |
| 0.021 g | phosphoric acid (85%) |
| 0.09 g | IR dye 66e |
| 0.33 g | 5-(4-Vinylbenzyl) thio-1,3,4-thiadiazole-2-thiole |
| 30 ml | propylene glycol monomethyl ether |
| 3 ml | acetone |

TABLE 1

| plate number | photopolymer layer | coating weight of the photopolymer layer | coating weight of the overcoat layer | exposure step | preheat step |
|---|---|---|---|---|---|
| 1 | Table 2 | 1.7 g/m² | 2.5 g/m² | 405 nm (30 mW) platesetter ANDROMEDA from Lithotech | 90° C. for 2 minutes |
| 2 | Table 3 | 1.7 g/m² | 2.0 g/m² | Trendsetter 3244 from Creo (830 nm, 40 to 90 mJ/cm²) | 90° C. for 2 minutes |
| 3 | Table 4 | 1.7 g/m² | 0.6 g/m² | Trendsetter 3244 from Creo (830 nm, 40 to 90 mJ/cm²) | none |
| 4 | Table 5 | 1.5 g/m² | 3 g/m² | 405 nm (30 mW) platesetter ANDROMEDA from Lithotech | none |
| 5 | Table 6 | 2.0 g/m² | 2.0 g/m² | Theimer vacuum frame equipped with Ga-doped Hg-lamp | 90° C. for 2 minutes |

TABLE 4

| | |
|---|---|
| 2.92 g | of a copolymer prepared by the reaction of 20 mol % methacrylic acid and 80 mol % allyl methacrylate |
| 3.93 g | a solution of 30 weight % in methyl ethyl ketone of an oligomer made by reaction of Desmodur N100 with HEMA and PETA |
| 1.18 g | NK Ester BPE-200 |
| 0.10 g | anilino diacetic acid |
| 0.15 g | 2-(4-methoxyphenyl)4.6-trichlormethyl-1,3,5-triazin |
| 0.07 g | Basonyl Violet 610 |
| 0.02 g | phosphoric acid (85%) |
| 0.09 g | IR dye 66e |
| 0.12 g | 5-(4-vinylbenzyl) thio-1,3,4-thiadiazole-2-thiol |
| 0.18 g | Kayamer PM-2 |
| 38 ml | propylene glycol monomethyl ether |
| 4 ml | 2-butanone |

TABLE 5

| | |
|---|---|
| 1.62 g | a copolymer made of allyl methacrylate and methacrylic acid with an acid number of 55 |
| 0.28 g | of a dispersion in propylene glycol mono methyl ether containing 7.25 wt.-% of copper phthalocyanine and 7.25 wt.-% of a polyvinylacetal binder containing 39.9 mol % vinyl alcohol, 1.2 mol % vinylacetate, 15.4 mol % acetal groups derived from acetaldehyde, 36.1 mol % acetal groups derived from butyraldehyde and 7.4 acetal groups derived from 4-formylbenzoic acid |
| 0.02 g | Kayamer PM-2 |
| 0.2 g | butyl-3-methyl-imidazolium tetrafluoroborat |
| 2.745 g | of a 80% methyl ethyl ketone solution of an urethane acrylate prepared by reacting Desmodur N 100 ® (available from BAYER, Germany) comprising hydroxy ethyl acrylate and pentaerythritol triacrylate having a double-bond content of 0.5 double bonds/100 g when all isocyanate groups are completely reacted with the hydroxy group containing acrylates |
| 0.15 g | NK Ester BPE-500 |
| 1.1 g | 2-phenyl-4-(2-chlorophenyl)-5-(4-diethylaminophenyl)-oxazole |
| 0.27 g | 2,2-bis-(-2-chlorophenyl)-4,5,4',5'-tetraphenyl-2'H-[1,2'] biimidazolyl |
| 0.12 g | 3-mercapto-1,2,4-triazol |
| 9 g | propylene glycol monomethyl ether |
| 6 g | methanol |
| 7.25 g | butanone |

TABLE 6

| | |
|---|---|
| 2.1 g | of a terpolymer prepared by polymerization of 476 parts by wt. styrene, 476 parts by wt. methyl methacrylate and 106 parts by wt. methacrylic acid |
| 5.24 g | of a 80% methyl ethyl ketone solution of an urethane acrylate prepared by reacting Desmodur N 100 ® (available from BAYER, Germany) comprising hydroxyethyl acrylate and pentaerythritol triacrylate having a double-bond content of 0.5 double bonds/100 g when all isocyanate groups are completely reacted with the hydroxy group containing acrylates |
| 1.29 g | dipentaerythritolpentaacrylate |
| 0.6 g | 2,4-trichloromethyl-6[(4-ethoxyethylenoxy)naphthyl] 1,3,5-triazine |
| 0.16 g | 4,4'-N,N-diethylaminobenzophenone |
| 0.2 g | benzophenone |
| 0.19 g | 3-mercapto-1,2,4-triazol |
| 0.12 g | Renolblue B2G-HW |
| 0.1 g | Leuco-crystal violet |

TABLE 7

| Processing liquid | Components | Composition | pH |
|---|---|---|---|
| D1 | Water | 84.99 wt-% | 12.1 |
| | Surfynol 465 | 5 wt-% | |
| | Sodium tri phosphate | 5 wt-% | |
| | Sorbidex | 10 wt-% | |
| | Anti-foam agent K900 | 0.01 wt-% | |
| D2 | Water | 79.99 wt-% | 11.9 |
| | Surfynol 465 | 5 wt-% | |
| | Sodium tri phosphate | 5 wt-% | |
| | Dextrin (Emdex 30 AN 45) | 10 wt-% | |
| | Anti-foam agent K900 | 0.01 wt-% | |
| CD1 | Water | 94.84 wt-% | 12.2 |
| | Potassium hydroxide solution (45 wt-%) | 0.169 wt-% | |
| | PC1199 | 4.992 wt-% | |
| CD2 | Water | 91.9 wt-% | 9.9 |
| | REWOPOL ® NLS 28 | 3.4 wt-% | |
| | 2-phenoxy ethanol | 1.8 wt-% | |
| | diethanol amine | 1.1 wt-% | |
| | TEXAPON ® 842 | 1.0 wt-% | |
| | NEKAL ® Paste | 0.6 wt-% | |
| | 4-toluenesulfonic acid | 0.2 wt-% | |
| CD3 | Water | 94.8 wt-% | 12.2 |
| | Surfynol 465 | 2.5 wt-% | |
| | Amphotensid B5 | 2.5 wt-% | |
| | Potassium hydroxide solution (45 wt-%) | 0.2 wt-% | |
| CD4 | Water | 80.5 wt-% | 5.5 |
| | Dowfax 2A1 | 19 wt-% | |
| | Citric Acid × $H_2O$ | 0.5 wt-% | |
| CD5 | Water | 75.4 wt-% | 6.5 |
| | Dowfax 8390 | 20 wt-% | |
| | Potassium hydroxide 90% | 1.7 wt-% | |
| | Phosphoric Acid 85% | 2.7 wt-% | |
| | Mergal K7 | 0.2 wt-% | |

TABLE 8

Results of Examples 1 to 10 and Comparative Examples 1 to 15

| | Processing liquid | plate number | developability (s) | photospeed | clean up | scumming on press | print run length |
|---|---|---|---|---|---|---|---|
| Example 1 | D1 | 1 | 15 | 50 $\mu J/cm^2$ | <20 | no | 20000 |
| Example 2 | D1 | 2 | 20 | 130 $mJ/cm^2$ | <20 | no | 20000 |
| Example 3 | D1 | 3 | 20 | 80 $mJ/cm^2$ | <20 | no | 20000 |

TABLE 8-continued

Results of Examples 1 to 10 and Comparative Examples 1 to 15

|  | Processing liquid | plate number | developability (s) | photospeed | clean up | scumming on press | print run length |
|---|---|---|---|---|---|---|---|
| Example 4 | D1 | 4 | 25 | 80 µJ/cm² | <20 | no | 20000 |
| Example 5 | D1 | 5 | 20 | 10 mJ/cm² | <20 | no | 20000 |
| Example 6 | D2 | 1 | 15 | 50 µJ/cm² | <20 | no | 20000 |
| Example 7 | D2 | 2 | 20 | 130 mJ/cm² | <20 | no | 20000 |
| Example 8 | D2 | 3 | 20 | 80 mJ/cm² | <20 | no | 20000 |
| Example 9 | D2 | 4 | 25 | 80 µJ/cm² | <20 | no | 20000 |
| Example 10 | D2 | 5 | 20 | 10 mJ/cm² | <20 | no | 20000 |
| Comparative Example 1 | CD1 | 1 | 20 | 50 µJ/cm² | >100 | yes | 1000 |
| Comparative Example 2 | CD1 | 4 | 20 | 40 µJ/cm² | >100 | yes | 1000 |
| Comparative Example 3 | CD1 | 5 | 25 | 10 mJ/cm² | >100 | yes | 1000 |
| Comparative Example 4 | CD2 | 2 | 20 | 130 mJ/cm² | >100 | yes | 1000 |
| Comparative Example 5 | CD3 | 3 | 20 | 80 mJ/cm² | >100 | yes | 1000 |
| Comparative Example 6 | CD4 | 1 | not developable |  |  |  |  |
| Comparative Example 7 | CD4 | 2 | not developable |  |  |  |  |
| Comparative Example 8 | CD4 | 3 | not developable |  |  |  |  |
| Comparative Example 9 | CD4 | 4 | not developable |  |  |  |  |
| Comparative Example 10 | CD4 | 5 | not developable |  |  |  |  |
| Comparative Example 11 | CD5 | 1 | not developable |  |  |  |  |
| Comparative Example 12 | CD5 | 2 | not developable |  |  |  |  |
| Comparative Example 13 | CD5 | 3 | not developable |  |  |  |  |
| Comparative Example 14 | CD5 | 4 | not developable |  |  |  |  |
| Comparative Example 15 | CD5 | 5 | not developable |  |  |  |  |

In Examples 1-10, the tests using the processing liquids D1 and D2 in a single bath processing machine without prewash or postrinse showed good roll up behavior and no scumming on press at print start or restart. Comparative Examples 1-5 using developers which contain alkaline agents and surfactants but no hydrophilic film forming polymer like Sorbidex exhibited good developability however scumming on press was severe. With comparative examples 6-15, (processing liquid) containing hydrophilic polymers and surfactants but no alkaline agent, it is not possible to remove the non-image areas from the coated plate.

The invention claimed is:

1. Method of producing an imaged lithographic printing plate comprising:
   (a) imagewise exposing a negative working lithographic printing plate precursor comprising
      (i) a substrate with a hydrophilic surface
      (ii) a free-radical polymerizable coating and
      (iii) an oxygen-impermeable water-soluble or dispersible overcoat to radiation for which the free-radical polymerizable coating is sensitive,
   (b) treating the imagewise exposed precursor with an aqueous alkaline processing liquid comprising
      (i) water
      (ii) at least one surfactant
      (iii) at least one water-soluble film forming hydrophilic polymer
      (iv) at least one alkaline reagent in an amount sufficient for obtaining a pH of 9.5 to 14 and
      (v) optionally one or more additives selected from organic solvents, biocides, complexing agents, buffer substances, filter dyes, antifoaming agents, anticorrosive agents and radical inhibitors,
   (c) removing any excess of processing liquid from the treated precursor obtained in step (b),
   (d) optionally drying,
   (e) optionally baking,
   (f) mounting the precursor obtained in step (c), (d) or (e) on a press and then contacting it either simultaneously or subsequently with fountain solution and printing ink,
   with the proviso that there is no washing step between any of steps (a) to (f), with the further proviso that step (c) is not a washing step and with the further proviso that after step (b) there is no gumming step.

2. Method according to claim 1, wherein the free-radical polymerizable coating is sensitive to radiation of a wavelength selected from the range of 250 to 750 mn and in step (a) the precursor is imagewise exposed to radiation of a wavelength selected from the range of 250 to 750 nm.

3. Method according to claim 1, wherein the free-radical polymerizable coating is sensitive to radiation of a wavelength selected from the range of more than 750 to 1200 nm and in step (a) the precursor is imagewise exposed to radiation of a wavelength selected from the range of more than 750 to 1200 nm.

4. Method according to claim 1, wherein the water-soluble film forming hydrophilic polymer is selected from dextrines, and sugar alcohols.

5. Method according to claim 1, wherein the processing liquid has a pH of 10.5 to 13.

6. Method according to claim 1, wherein the processing liquid comprises a nonionic surfactant.

7. Method according to claim 1, wherein step (b) is carried out in a bath of processing liquid.

8. Method according to claim 1, wherein the excess of processing liquid is removed in step (c) by means of squeeze rollers.

9. Method according to claim 1, wherein the method consists of steps (a), (b), (c), (d) and (f).

10. Method according to claim 1, wherein the method further comprises a preheat step between steps (a) and (b).

* * * * *